(12) United States Patent
Kishikawa

(10) Patent No.: US 11,304,319 B2
(45) Date of Patent: Apr. 12, 2022

(54) MEMORY SYSTEM, MEMORY APPARATUS, AND MEMORY METHOD

(71) Applicant: KIOXIA CORPORATION, Minato-ku (JP)

(72) Inventor: Junya Kishikawa, Yokohama (JP)

(73) Assignee: KIOXIA CORPORATION, Minato-ku (JP)

( * ) Notice: Subject to any disclaimer, the term of this patent is extended or adjusted under 35 U.S.C. 154(b) by 70 days.

(21) Appl. No.: 16/553,808

(22) Filed: Aug. 28, 2019

(65) Prior Publication Data
US 2020/0288590 A1 Sep. 10, 2020

(30) Foreign Application Priority Data
Mar. 5, 2019 (JP) .............................. JP2019-039594

(51) Int. Cl.
*H05K 5/02* (2006.01)
*G02B 6/42* (2006.01)
*H05K 5/00* (2006.01)
*G11C 16/30* (2006.01)
*H02J 50/10* (2016.01)
*B60R 16/03* (2006.01)
(Continued)

(52) U.S. Cl.
CPC ........... *H05K 5/0213* (2013.01); *B60R 16/03* (2013.01); *G02B 6/428* (2013.01); *G02B 6/4273* (2013.01); *G11C 16/30* (2013.01); *H02J 50/10* (2016.02); *H05K 1/18* (2013.01); *H05K 5/0026* (2013.01); *H05K 5/0247* (2013.01); *B60R 16/0231* (2013.01); *H05K 2201/10121* (2013.01); *H05K 2201/10159* (2013.01)

(58) Field of Classification Search
CPC ...... H05K 1/18; H05K 5/0026; H05K 5/0247; H05K 2201/10121; H05K 2201/10159; H02J 50/10; B60R 16/03; B60R 16/0231; G02B 6/4273; G02B 6/428; G11C 16/30
See application file for complete search history.

(56) References Cited

U.S. PATENT DOCUMENTS 7,290,944 B2 * 11/2007 Ishigami .............. G02B 6/4201
385/88
8,299,639 B2 * 10/2012 Usami ................... F02N 15/067
290/38 R
(Continued)

FOREIGN PATENT DOCUMENTS

JP  WO 2014/147730 A1   9/2014
JP  2018-5907 A          1/2018

*Primary Examiner* — Abhishek M Rathod
*Assistant Examiner* — Keith DePew
(74) *Attorney, Agent, or Firm* — Oblon, McClelland, Maier & Neustadt, L.L.P.

(57) ABSTRACT

A memory system of embodiments includes a container, a first circuit board, a second circuit board, and an optical cable. The container has a hole connecting inside and outside the container. The first circuit board is disposed outside the container and has a first circuit to convert a first electric signal to an optical signal. The second circuit board is disposed inside the container and has a memory device, and a second circuit to convert the optical signal into a second electric signal and storing the second electric signal in the memory device. The optical cable transmits the optical signal from the first circuit board through the hole to the second circuit board.

9 Claims, 2 Drawing Sheets

(51) Int. Cl.
*H05K 1/18* (2006.01)
*B60R 16/023* (2006.01)

(56) References Cited

U.S. PATENT DOCUMENTS

| | | | |
|---|---|---|---|
| 8,469,606 B2* | 6/2013 | Becht | H05K 1/189 |
| | | | 385/88 |
| 8,723,366 B2* | 5/2014 | Fiorello | H02J 7/025 |
| | | | 307/104 |
| 9,384,441 B2 | 7/2016 | Heimlicher | |
| 9,704,090 B2 | 7/2017 | Kawano et al. | |
| 10,012,664 B2* | 7/2018 | Wasson | B01L 3/0279 |
| 10,225,927 B2* | 3/2019 | Morimoto | H05K 1/0203 |
| 10,289,588 B2 | 5/2019 | Chu et al. | |
| 10,389,037 B2* | 8/2019 | Johnson | H01Q 1/2291 |
| 10,416,407 B2* | 9/2019 | Sakurai | G02B 6/4246 |
| 2005/0105910 A1* | 5/2005 | Light | H04B 10/40 |
| | | | 398/137 |
| 2006/0257081 A1* | 11/2006 | Ishigami | G02B 6/4283 |
| | | | 385/92 |
| 2010/0183267 A1* | 7/2010 | Becht | G02B 6/4246 |
| | | | 385/88 |
| 2010/0231340 A1* | 9/2010 | Fiorello | H02J 7/0047 |
| | | | 336/92 |
| 2010/0264670 A1* | 10/2010 | Usami | F02N 15/067 |
| | | | 290/38 R |
| 2013/0034332 A1* | 2/2013 | Peng | H04B 1/036 |
| | | | 385/135 |
| 2013/0334892 A1* | 12/2013 | Hall | H02J 50/50 |
| | | | 307/104 |
| 2014/0296089 A1* | 10/2014 | Holmes | B01L 9/06 |
| | | | 506/9 |
| 2015/0077925 A1* | 3/2015 | Hunt | G06F 1/187 |
| | | | 361/679.39 |
| 2015/0255994 A1* | 9/2015 | Kesler | H02J 50/70 |
| | | | 307/10.1 |
| 2016/0073887 A1* | 3/2016 | Lee | A61B 5/0084 |
| | | | 600/377 |
| 2016/0269117 A1* | 9/2016 | Chang | G02B 6/4272 |
| 2017/0012706 A1* | 1/2017 | Livshits | H04B 10/2587 |
| 2018/0039411 A1 | 2/2018 | Stenfort | |
| 2018/0110146 A1* | 4/2018 | Coles | H05K 5/065 |
| 2018/0343737 A1* | 11/2018 | Morimoto | H01L 25/18 |
| 2019/0214750 A1* | 7/2019 | Pineda | H01R 13/639 |
| 2020/0225684 A1* | 7/2020 | Anderson | G05D 1/0022 |
| 2020/0233160 A1* | 7/2020 | Lee | G02B 6/4214 |
| 2020/0310008 A1* | 10/2020 | Kim | G06F 1/1684 |
| 2021/0012996 A1* | 1/2021 | Turner | H05H 7/08 |
| 2021/0215900 A1* | 7/2021 | Sue | G02B 27/646 |
| 2021/0239924 A1* | 8/2021 | Mizuno | G02B 6/4221 |

* cited by examiner

MEMORY SYSTEM, MEMORY APPARATUS, AND MEMORY METHOD

CROSS-REFERENCE TO RELATED APPLICATIONS

This application is based upon and claims the benefit of priority from Japanese Patent Application No. 2019-039594, filed on Mar. 5, 2019; the entire contents of which are incorporated herein by reference.

FIELD

Embodiments relate to a memory system, a memory apparatus, and a memory method including a nonvolatile semiconductor memory device such as a solid state drive (hereinafter referred to as "SSD").

BACKGROUND

Nonvolatile semiconductor memory devices such as SSDs are used in personal computers (hereinafter referred to as "PCs") as memory devices capable of reading and writing data at high speed. The needs for SSDs has been increased, in addition to for PCs, for external memory devices of engine control units (hereinafter referred to as "ECUs") of vehicles such as automobiles.

The SSDs for vehicle need to operate over a wide temperature range and have noise resistant. The operation temperature range of the SSD for PC is, for example, about 0° C. to 70° C., but the operation temperature range of the SSD for vehicle should be much wider, for example, about −40° C. to 100° C. In addition, since automobiles are noise sources, the SSDs for vehicle require noise measures. The conventional SSDs are difficult to be used in vehicles because of their too narrow operation temperature range as for in-vehicle use and the requirement of noise measures.

DETAILED DESCRIPTION

A memory system of embodiments includes a container, a first circuit board, a second circuit board, and an optical cable. The container has a hole connecting inside and outside the container. The first circuit board is disposed outside the container and has a first circuit to convert a first electric signal to an optical signal. The second circuit board is disposed inside the container and has a memory device, and a second circuit to convert the optical signal into a second electric signal and storing the second electric signal in the memory device. The optical cable transmits the optical signal from the first circuit board through the hole to the second circuit board.

Hereinafter, embodiments will be described in detail with reference to the drawings.

Figure 1:
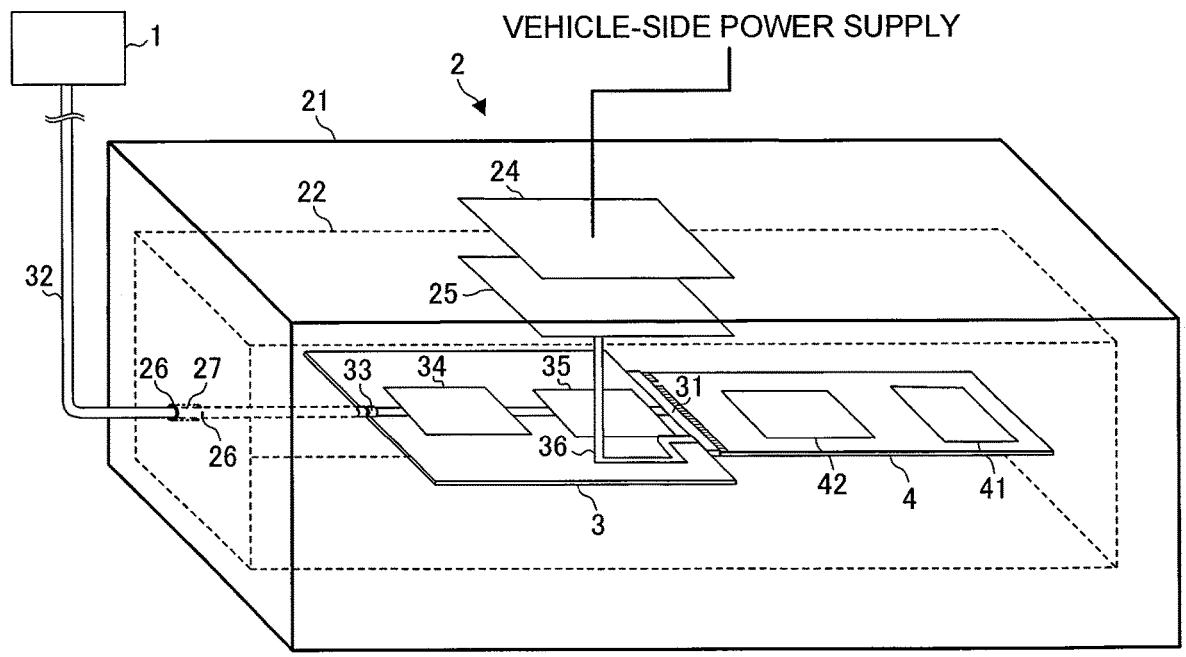
FIG. 1 is a perspective view illustrating the configuration of the memory system of the embodiment.
Figure 2:
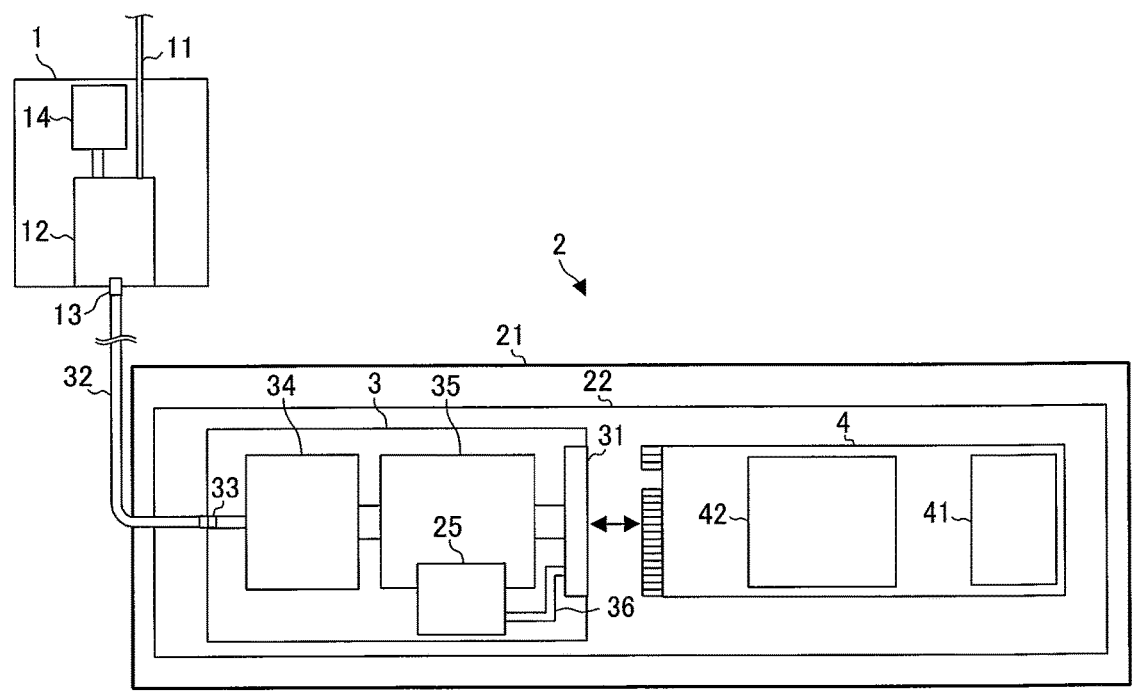
FIG. 2 is a plan view illustrating the configuration of the memory system in a plan view.
Figure 3:
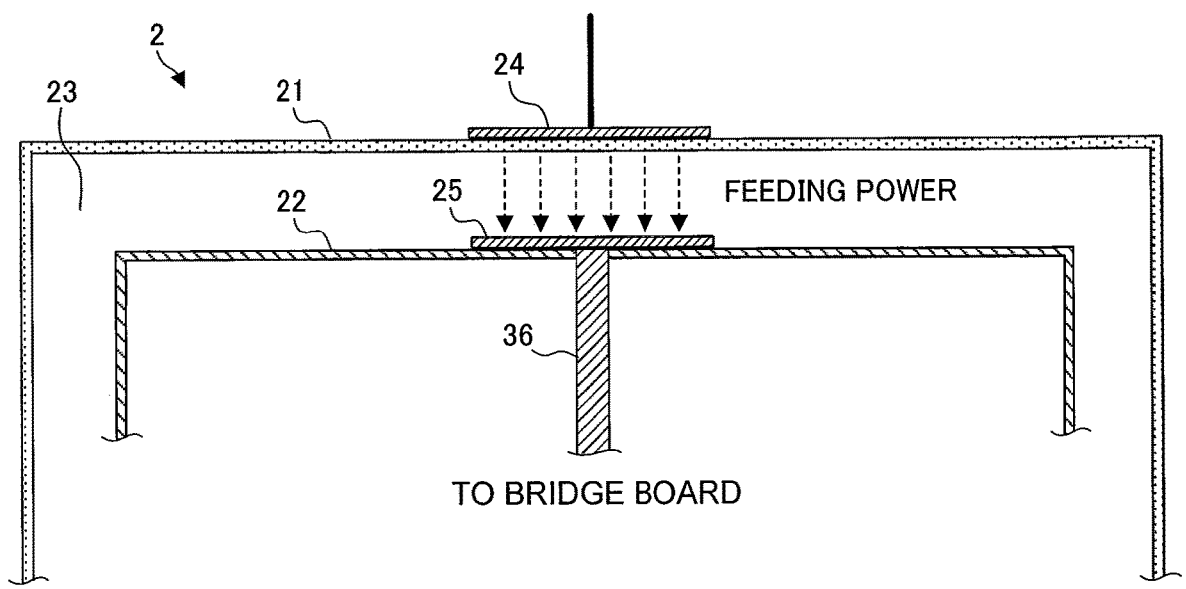
FIG. 3 is a diagram illustrating a wireless power feeding circuit.

FIG. 1 is a perspective view illustrating the configuration of a memory system of the embodiment. FIG. 2 is a plan view thereof. FIG. 3 is a diagram illustrating a wireless power feeding circuit.

As shown in FIG. 1 to FIG. 3, the memory system of the embodiment includes a light source side board 1 (a first circuit board), a bridge board 3 (a second circuit board), and a container 2 (housing). The container 2 has a wall member (an outer container 21, and an inner container 22) with a heat insulation structure (heat protection structure). The inner container 22 accommodates the bridge board 3. The bridge board 3 mounts (connects to), for example, a flash memory (a nonvolatile semiconductor memory device) such as the M.2 SSD module 4.

The light source side board 1 includes a signal line 11, a light emitting circuit 12, an optical connector 13, and a power supply terminal 14. The signal line 11 is connected to the ECU in a vehicle. The light emitting circuit 12 includes a light emitting element as a light source. The optical connector 13 detachably connects to an optical digital cable 32 (hereinafter referred to as "optical cable 32"). The power supply terminal 14 receives power from the vehicle (such as battery in the vehicle).

The signal line 11 transmits an electric signal (data) as a memory target from the ECU. The light emitting circuit 12 is driven based on the power supplied to the power supply terminal 14. The light emitting circuit 12 converts an electric signal (data) received from the signal line 11 into an optical signal and outputs the optical signal to the optical cable 32. The light source side board 1 is disposed, for example, near an ECU in an engine room of a vehicle.

The container 2 is a double structured (a vacuum bottle structure) casing, and includes, for example, a glass outer container 21 and a stainless steel inner container 22, as shown in FIG. 3. A vacuum layer 23 in a high vacuum state is disposed between the outer container 21 and the inner container 22. The internal pressure of the inner container 22 maintains at the atmospheric pressure.

The container 2 is arranged, for example, in a space under a dashboard or in a trunk room of the vehicle. The distance between the container 2 and the light source sideboard 1 is about several meters, and they are connected by the optical cable 32.

The feeding antenna element 24 is disposed on the upper surface of the outer container 21. The feeding antenna element 24 is, for example, a spiral flat coil. The feeding antenna element 24 wirelessly supplies power from a vehicle-side power supply (such as a 12V or 5V power supply circuit).

The power receiving antenna element 25 is fixed to the upper surface of the inner container 22 so as to face the power feeding antenna element 24. The power receiving antenna element 25 is connected to the power receiving wire 36 from the bridge board 3. The power receiving antenna element 25 receives power from the power feeding antenna element 24 and supplies the power to the bridge board 3 (photoelectric conversion circuit 35, M.2 SSD module 4) through the power receiving wiring 36. That is, the feeding antenna element 24 and the receiving antenna element 25 construct a wireless power feeding circuit, and wirelessly feed power from the outside of the container 2 to the bridge board 3 in the container 2.

The holes 26 (openings) are disposed on wall surfaces of the container 2. The holes 26 have a size corresponding to the outer shape of the optical cable 32. The optical cable 32 passes through the holes 26 and is connected to the bridge board 3 in the housing of the container 2 (the wall member such as the outer container 21 and the inner container 22). The optical cable 32 has an outer diameter smaller than that of a communication cable (a cable such as USB or SATA)

of a metal wire. Using the optical cable 32 enables the opening in the wall surface of the container 2 smaller.

The optical cable 32 has a core of an optical fiber and transmits an optical signal. The optical cable 32 connects the light source side board 1 to the bridge board 3 and transmits an optical signal from the light source sideboard 1 to the bridge board 3.

The holes 26 penetrate the outer container 21 and the inner container 22 of the container 2. A tube 27 is attached through the holes 26. The tube 27 passes through the optical cable 32. The inner diameter of the tube 27 (the outer diameter of the hole 26) can be the smallest diameter through which the optical cable 32 passes. An adhesive is applied to the tube 27, the holes 26, and the surrounding wall surfaces to seal them. This sealing maintains the vacuum state (the vacuum bottle structure) in the container.

The bridge board 3 includes an SSD connector 31, alight receiving circuit 34, a photoelectric conversion circuit 35, and a power receiving antenna element 25. The SSD connector 31 detachably mounts the M.2 SSD module 4. The light receiving circuit 34 includes an optical connector 33 to which the optical cable 32 is connected. The power receiving antenna element 25 is disposed on the inner surface of the inner container 22 and faces (corresponds to) the power feeding antenna element 24 on the top surface of the container 2.

The light receiving circuit 34 receives an optical signal transmitted from the light source side board 1 through the optical cable 32. The photoelectric conversion circuit 35 photoelectrically converts the optical signal received by the light receiving circuit 34 into an electric signal (data), and transmits the electric signal (data) to the M.2 SSD module 4 through the SSD connector 31.

The M.2 SSD module 4 mounts, for example, a nonvolatile semiconductor memory device 41 (hereinafter referred to as "NAND 41") such as a NAND flash memory, and a controller 42 (hereinafter referred to as "SoC 42"). The term "SoC" is an abbreviation of System-on-a-Chip.

The SoC 42 controls, for example, to write, read, erase, and rewrite an electric signal (that is, data) transmitted from the photoelectric conversion element 35 to the NAND 41. In other words, the bridge board 3 stores data extracted from the optical signal into the M.2 SSD module 4.

Then, the operation of the memory system of this embodiment will be described. This memory system inputs data from the vehicle side to the light source side board 1. The light source side board 1 converts this data into an optical signal at the light emitting element 12. The optical signal is transmitted to the bridge board 3 inside the container 2 through the optical cable 32.

In the bridge board 3, the light receiving element 34 receives an optical signal, and the photoelectric conversion element 35 converts the optical signal into an electric signal. This electric signal is passed to the M.2 SSD module 4 through the SSD connector 31 and stored as data in the NAND 41.

As described above, according to the memory system of the embodiment, the bridge board 3 mounting the M.2 SSD module 4 is accommodated in the container 2 with the vacuum bottle structure. This enables to greatly improve the thermal insulation property, and to expand the operation temperature range.

The container 2 accommodating the bridge board 3 is connected to the light source sideboard 1 with the optical cable 32. This optical connection eliminates restrictions on the mounting location of the M.2 SSD module 4 to enable a free layout. Also, the optical cable 32 can transmit signal over a long distance without an influence of electrical noise. For this reason, even if the distance between the light source side board 1 and the container 2 (SSD) is certainly large, the transmission is little affected by the electrical noise. For example, the light source side board 1 can be disposed in an engine room of vehicles, and the container 2 can be disposed in a space under the dashboard of the vehicle. As a result, the M.2 SSD module 4 can be protected from engine noise.

Connecting the container 2 to the light source sideboard 1 with the optical cable 32 enables to downsize the opening of the hole 26 of the container 2 into the outer size of the optical cable 32, minimizing the holes 26 in the wall surface of the container 2.

The bridge board 3 in the container 2 is wirelessly fed power from outside the container 2 to electrically insulate its power system from the outside. This electrical insulation reduces latency, crosstalk, heat generation, and the possibility of deteriorating signal quality.

The wireless power feeding from outside the container 2 enables power supply to the container 2 without forming a hole (opening) not for signal transmission, facilitating the maintenance of the airtightness in the container 2. Further, the M.2 SSD module 4 is detachably attached to the SSD connector 31, facilitating operations such as replacement, memory capacity change, and repair of the module 4.

As described above, the memory system can be mounted on the vehicle by widening an operation temperature range and applying the noise measures.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
a container including an outer container and an inner container disposed in the outer container, the container forming a heat insulation structure between the outer container and the inner container, the container including a hole connecting an inside of the inner container and an outside of the outer container;
a first circuit board disposed outside the outer container, the first circuit board having a first circuit configured to convert a first electric signal to an optical signal;
a second circuit board housed inside the inner container, the second circuit board having
a memory device and
a second circuit configured to:
convert the optical signal into a second electric signal, and
store the second electric signal in the memory device; and
an optical cable configured to transmit the optical signal from the first circuit board to the second circuit board through the hole;
wherein the heat insulation structure includes a vacuum laver between the outer container and the inner container.

2. The memory system according to claim 1, wherein the hole has a shape corresponding to an outer shape of the optical cable.

3. The memory system according to claim 1,
wherein the second circuit board includes:
  a light receiving circuit connected to the optical cable through the hole, and
  a conversion circuit configured to convert the optical signal received by the light receiving circuit into the second electric signal.

4. The memory system according to claim 1, further comprising:
  a first feeding antenna element disposed on a surface of the outer container;
  a second feeding antenna element disposed on a surface of the inner container;
  a wireless power feeding circuit to wirelessly receive power from outside of the container through the first and second feeding antenna elements to the second circuit board inside the container.

5. The memory system according to claim 1,
wherein the second circuit board has a connector configured to detachably mount the memory device.

6. A memory apparatus using an optical cable, comprising:
  a container including an outer container and an inner container disposed in the outer container, the container forming a heat insulation structure between the outer container and the inner container, the container including a hole connecting an inside of the inner container and an outside of the outer container for leading the optical cable therethrough; and
  a circuit board housed in the inner container,
  the circuit board including;
    a memory device,
    a light receiving circuit configured to receive an optical signal to be sent through the optical cable,
    a conversion circuit configured to convert the optical signal received by the light receiving circuit into an electric signal to be stored in the memory device,
  wherein the heat insulation structure includes a vacuum layer between the outer container and the inner container.

7. The memory apparatus according to claim 6,
wherein the hole has a shape corresponding to an outer shape of the optical cable.

8. The memory apparatus according to claim 6, further comprising:
  a first feeding antenna element disposed on a surface of the outer container;
  a second feeding antenna element disposed on a surface of the inner container;
  a wireless power feeding circuit to wirelessly receive power from outside of the container through the first and second feeding antenna elements to the circuit board inside the container.

9. The memory apparatus according to claim 6,
wherein the circuit board has a connector configured to detachably mount the memory device.

* * * * *